United States Patent
Kawaguchi et al.

(10) Patent No.: US 11,065,654 B2
(45) Date of Patent: Jul. 20, 2021

(54) IN SITU VAPOR DEPOSITION POLYMERIZATION TO FORM POLYMERS AS PRECURSORS TO VISCOELASTIC FLUIDS FOR PARTICLE REMOVAL FROM SUBSTRATES

(71) Applicant: LAM RESEARCH CORPORATION, Fremont, CA (US)

(72) Inventors: Mark Kawaguchi, San Carlos, CA (US); Gregory Blachut, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 249 days.

(21) Appl. No.: 16/017,445

(22) Filed: Jun. 25, 2018

(65) Prior Publication Data
US 2019/0015878 A1    Jan. 17, 2019

Related U.S. Application Data

(60) Provisional application No. 62/533,320, filed on Jul. 17, 2017.

(51) Int. Cl.
| | | |
|---|---|---|
| *H01L 21/02* | (2006.01) | |
| *B08B 7/00* | (2006.01) | |
| *H01L 21/677* | (2006.01) | |
| *H01L 21/66* | (2006.01) | |

(52) U.S. Cl.
CPC ........ *B08B 7/0014* (2013.01); *H01L 21/0206* (2013.01); *H01L 21/02057* (2013.01); *H01L 21/02118* (2013.01); *H01L 21/02271* (2013.01); *H01L 21/02334* (2013.01); *H01L 21/67742* (2013.01); *H01L 22/26* (2013.01)

(58) Field of Classification Search
CPC ... B08B 3/04; B08B 7/0014; H01L 21/02057; H01L 21/67028; H01L 21/6704; H01L 21/67051; H01L 21/67017; H01L 21/67023; H01L 21/0262; H01L 21/02263; H01L 21/02269; H01L 21/02271; H01L 21/02334; H01L 22/26; H01L 21/00–86; C23C 16/00–56; B05D 1/60; B05D 1/62; C11D 11/0047
See application file for complete search history.

(56) References Cited

U.S. PATENT DOCUMENTS 5,746,233 A * 5/1998 Kuroda ............... B08B 3/04
134/57 R
2007/0032620 A1* 2/2007 Gleason ............... B05D 1/60
526/217

(Continued)

OTHER PUBLICATIONS

International Search Report and Written Opinion for PCT Application No. PCT/US2018/041439 dated Oct. 31, 2018.

(Continued)

*Primary Examiner* — Mikhail Kornakov
*Assistant Examiner* — Richard Z. Zhang

(57) ABSTRACT

A method for cleaning a substrate includes supplying a vapor to a processing chamber to grow a polymer film on a substrate in the processing chamber; adding a solution to the polymer film on the substrate to create a viscoelastic fluid on the substrate; and removing the viscoelastic fluid to remove particle contaminants from the substrate.

24 Claims, 5 Drawing Sheets

(56) References Cited

U.S. PATENT DOCUMENTS

| 2010/0258142 | A1* | 10/2010 | Kawaguchi | H01L 21/02057 134/1.3 |
| 2010/0288311 | A1* | 11/2010 | Kholodenko | H01L 21/67051 134/26 |
| 2012/0132229 | A1 | 5/2012 | Zhu et al. | |
| 2014/0179106 | A1 | 6/2014 | Zhong et al. | |
| 2016/0064212 | A1 | 3/2016 | Thedjoisworo et al. | |
| 2017/0125240 | A1 | 5/2017 | Takahashi et al. | |

OTHER PUBLICATIONS

Travis W. Walker et al.; "Enhanced Particle Removal Using Viscoelastic Fluids"; Journal of Rheology; Dec. 11, 2013; pp. 63-88.

Wyatt E. Tenhaeff et al.; "Initiated and Oxidative Chemical Vapor Deposition of Polymeric Thin Films: iCVD and oCVD"; Advanced Functional Materials; vol. 18, Issue 7; Apr. 11, 2008; pp. 979-992.

Kenneth K. S. Lau et al.; "Initiated Chemical Vapor Deposition (iCVD) of Poly (alkyl acrylates): An Experimental Study"; Macromolecules, 39, (10); Apr. 11, 2006; pp. 3688-3694.

* cited by examiner

IN SITU VAPOR DEPOSITION POLYMERIZATION TO FORM POLYMERS AS PRECURSORS TO VISCOELASTIC FLUIDS FOR PARTICLE REMOVAL FROM SUBSTRATES

CROSS-REFERENCE TO RELATED APPLICATIONS

This application claims the benefit of U.S. Provisional Application No. 62/533,320, filed on Jul. 17, 2017. The entire disclosure of the application referenced above is incorporated herein by reference.

FIELD

The present disclosure relates to substrate processing systems and methods, and more particularly to systems and methods for removing particles from substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform substrate treatments such as cleaning, deposition, etching or photoresist removal. The substrate processing systems include a processing chamber and a substrate support. A substrate such as a semiconductor wafer may be arranged on the substrate support during treatment. In some processes, substrate temperature and/or pressure in the chamber are controlled. During etching or photoresist removal, a gas mixture is delivered to the processing chamber. The gas mixture may be introduced into the processing chamber to etch the substrate or to remove photoresist on the substrate. In some substrate processing systems, plasma may also be used to activate chemical reactions.

After the substrate treatment is complete, the substrate may be cleaned to remove surface particulate contaminants (also referred to herein as particles) before further substrate processing is performed to prevent defects. For example, a spin chuck may be used to rotate the substrate while a cleaning liquid is dispensed onto one or both surfaces of the substrate. The cleaning liquid removes some of the particles. However, in some examples, the cleaning process is not capable of removing the particles adequately.

Advanced mechanical cleaning methods using polymer-containing, viscoelastic fluids have been used to remove particles during processing. However, there are difficulties in implementing advanced mechanical cleaning methods during processing of semiconductor substrates. The polymer that is used to make the polymer-containing, viscoelastic fluids does not have sufficient cleanliness for semiconductor processing. In addition, it is difficult to deliver the viscoelastic fluid to the liquid dispenser of the tool. In particular, it is difficult to pump the viscoelastic fluid through system lines and to reliably and repeatedly dispense the viscoelastic fluid onto the substrate.

The viscoelastic fluid is formulated outside of the tool by mixing polymer, base, buffer salts, and/or surfactants. The viscoelastic fluid is then delivered to the substrate surface via the system lines. Sourcing a polymer that is clean enough for semiconductor substrates has been difficult due to particulate contamination and/or metal content problems. Once the viscoelastic fluid is formulated, it is very difficult to filter, which further exacerbates the issue of particle contamination. Due to the viscoelastic nature of the formulation (specifically, the formulations have the properties of strain-hardening and shear thinning), it is very difficult to pump the viscoelastic fluid from a storage tank to a surface of the substrate in a high-volume manufacturing setting.

The physical size of the polymer is relatively large. Therefore, it is difficult for the viscoelastic fluid to clean inside deep trenches or in other high-aspect ratio (HAR) structures when poured or dispensed on the substrate.

SUMMARY

A method for cleaning a substrate includes supplying a vapor to a processing chamber to grow a polymer film on a substrate in the processing chamber. The method includes adding a solution to the polymer film on the substrate to create a viscoelastic fluid on the substrate. The method includes removing the viscoelastic fluid to remove particle contaminants from the substrate.

In other features, the vapor further comprises at least one monomer and an initiator. The method includes using a source of energy to decompose the initiator. The solution includes at least one of water, buffered water, an acid, a base, buffer salts and surfactants.

In other features, the method include creating a temperature differential between the substrate and other surfaces in the processing chamber while growing the polymer film. The substrate is maintained at a lower temperature than the other surfaces to promote adsorption of the polymer film on the substrate.

In other features, a predetermined volume of the solution is added. The solution is added to produce a final desired concentration of polymer. After supplying the vapor and growing the polymer film and before adding the solution, the method includes moving the substrate to a second processing chamber.

In other features, pressure in the processing chamber is maintained at a predetermined pressure in a pressure range from 50 mTorr to 10 Torr while growing the polymer film. The method includes supplying at least one of water vapor and an additive to the processing chamber at least one of while supplying the vapor and after supplying the vapor. The at least one of water vapor and an additive at least partially hydrate the polymer film. The additive comprises at least one of ammonia vapor and a vapor of a volatile amine.

In other features, the method includes agitating the substrate at least one of while supplying the solution and after supplying the solution. Adding the solution includes dispensing the solution onto the substrate.

In other features, the method includes monitoring at least one of a weight of the substrate while the solution is added and a volume of the solution that is added and controlling addition of the solution to the substrate based on the at least one of the weight and the volume.

In other features, growing the polymer film on the substrate includes using initiated chemical vapor deposition (iCVD). The source of energy includes a heated surface. The heated surface comprises a wire filament.

A method for cleaning a substrate includes supplying a vapor including at least one monomer and an initiator to a processing chamber including a substrate; using a source of energy to trigger a reaction in the vapor and to cause a polymer film to be deposited on the substrate in the processing chamber. The source of energy is selected from a group consisting of a heat source, a light source and a radiation source. The method includes adding a solution to the polymer film on the substrate to create a viscoelastic fluid on the substrate.

In other features, the method includes removing the viscoelastic fluid to remove particle contaminants from the substrate. The solution includes at least one of water, buffered water, an acid, a base, buffer salts and surfactants.

In other features, the method includes creating a temperature differential between the substrate and other surfaces of the processing chamber while growing the polymer film. The substrate is maintained at a lower temperature than the other surfaces to promote adsorption of the polymer film on the substrate.

In other features, prior to adding the solution, the method includes supplying at least one of water vapor and an additive to the processing chamber to at least partially hydrate the polymer film.

In other features, adding the solution includes dispensing the solution onto the substrate; monitoring a weight of the substrate while the solution is added; and controlling addition of the solution to the substrate based on the weight.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
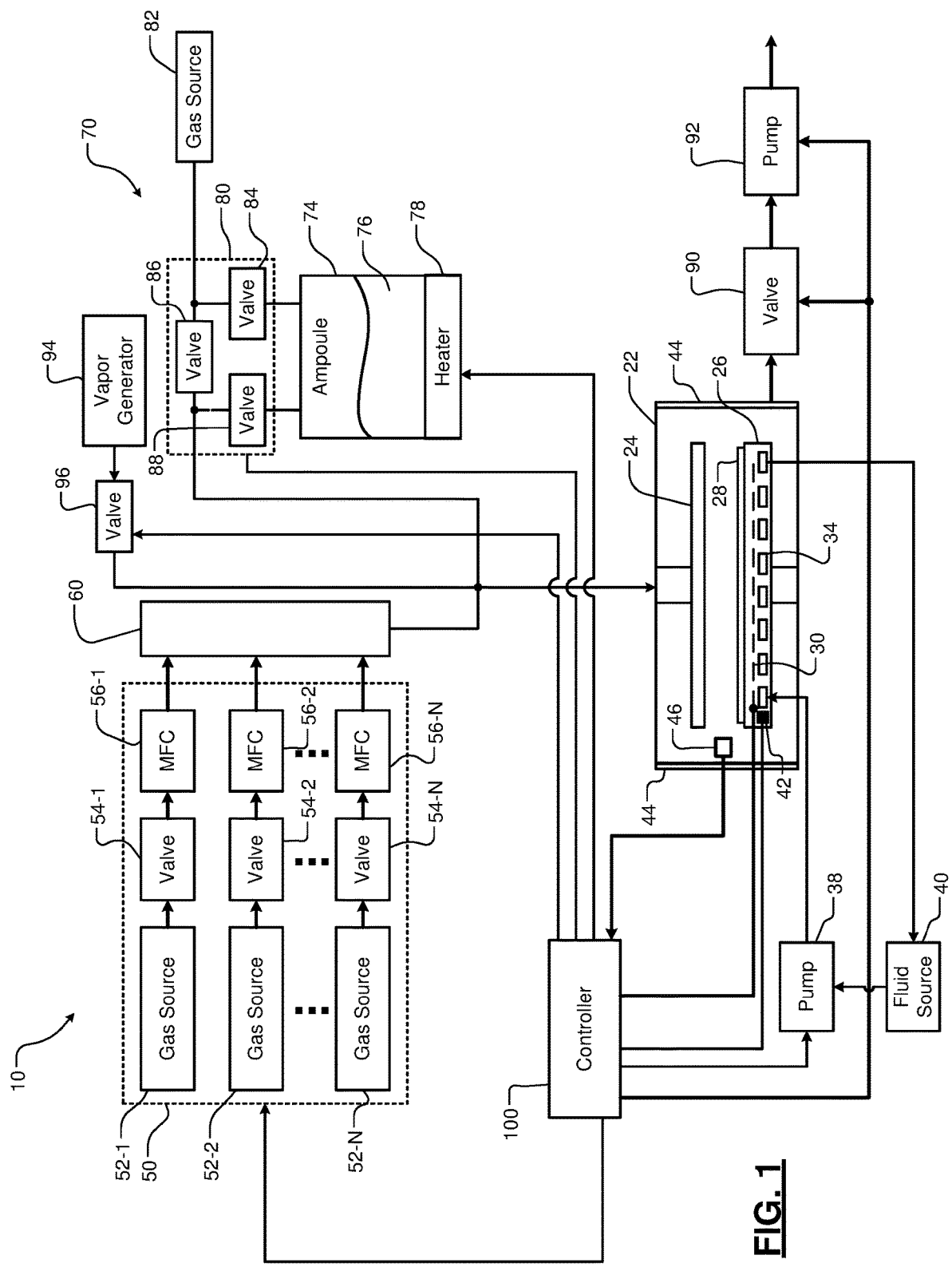
FIG. 1 is a functional block diagram of an example of a substrate processing system for performing vapor deposition polymerization (VDP) of a polymer as a precursor for a viscoelastic fluid using chemical vapor deposition (CVD) according to the present disclosure.

Systems and methods according to the present disclosure use a vapor deposition polymerization (VDP) process to grow a polymer film directly on the substrate. A solution is added to the polymer film on the substrate to create a polymer-containing, viscoelastic fluid directly on the substrate. The polymer-containing, viscoelastic fluid is subsequently removed to remove particulate contaminants. In some examples, removal is performed by rinsing or other methods.

In some examples, the systems and methods according to the present disclosure integrate a VDP chamber for depositing the polymer film with a cleaning process. Vapor-based precursor is delivered to the VDP chamber to grow the polymer film. In some examples, the VDP of a copolymer (such as polyacrylamide-random-poly(acrylic acid)) is performed. In some examples, the polymer film is reconstituted into a viscoelastic fluid by addition of buffered water or other solvent.

The systems and methods described herein can be performed in a variety of different situations. In some examples, the systems and methods are performed as part of a series of wet clean steps or at the end of a cleaning sequence. In another example, the systems and methods are performed after substrate treatment such as dry etching or photoresist removal to remove particulate contaminants created by the substrate treatment.

As will be described further below in conjunction with FIG. 1, VDP can be performed in a processing chamber that is similar to a traditional CVD chamber. However, other types of chambers may be used. In general, the processing chamber is maintained at a predetermined pressure and monomers and/or other reactants are supplied in the vapor phase. In some examples, the predetermined pressure is in a pressure range from 50 mTorr to 10 Torr, although other pressures can be used.

Surfaces of the processing chamber may be heated to prevent adsorption onto the surfaces. The substrate can be temperature controlled and/or cooled by the substrate support to a temperature that is less than other surfaces in the processing chamber to promote adsorption of the vapor-phase reagents onto the surface of the substrate. In some examples, initiated chemical vapor deposition (iCVD), a specific form of VDP, is performed. iCVD uses a plurality of hot filament wires that decompose an initiator used to initiate polymerization.

Once the substrate is in the processing chamber and the predetermined chamber pressure is reached, vapors of the monomer(s), initiator(s), and/or other non-reactive components such as solvent molecules (e.g. water) are supplied to the processing chamber. A source of energy (such as the hot filaments in iCVD or other heat, light or radiation source) triggers the reaction (usually by decomposing the initiators to form reactive groups). When the substrate is kept at a lower temperature than the rest of the assembly, the vapors preferentially adsorb onto the substrate and the substrate surface is the location where the polymerization reaction primarily occurs.

In some examples, random copolymers of polyacrylamide and poly(acrylic acid) may be used for particle removal. Therefore in some examples, the polymer of these monomers is used. However, other polymers or polymer architectures can be used. For example, crosslinking agents may be added to the polymer to increase apparent molecular weight and modulate rheological properties thereof. Or as another example, a variety of other polymers can be used for particle removal. In some examples, monomers which make water-soluble or alcohol-soluble polymers (and not organic-soluble polymers) are used since the rinsing fluids in high volume manufacturing are often deionized water or low boiling alcohols (chiefly isopropyl alcohol). In other examples, monomers with relatively high vapor pressures are used to allow adequate delivery of precursor into the chamber. With these constraints in mind, suitable monomers include primary, secondary, or tertiary acrylamide derivatives with relatively short alkyl groups (less than four carbons). One example is N,N-dimethylacrylamide due to the high water solubility of its polymer and moderately high vapor pressure of the monomer (approximately 10 torr at 70° C.). Other monomers include acrylates or methacrylates with hydrophilic functional groups. Two examples of these are 2-hydroxyethyl acrylate and 2-(dimethylamino)ethyl acrylate.

There are other monomers that may be suitable that do not fit into these categories. One example is N-vinylpyrrolidone. In some examples, random copolymers are created using a monomer including a carboxylic acid group, such as acrylic acid, methacrylic acid, or 2-carboxyethyl acrylate. The incorporation of the organic acid serves many roles. First, it generally increases the water-solubility of the final polymer. In addition, when formulated with base, the carboxylic acid becomes deprotonated and exists in a charged form; this charged form increases the viscosity of the polymer due to charge repulsion effects, which produces more desirable rheology. The ratio of acid monomer to hydrophilic monomer may be changed dynamically by adjusting flow-rates during deposition. Some applications may be found to require a different ratio for optimal performance. It may also be possible that 100% acid monomer or 100% hydrophilic monomer may be the optimal composition.

The progress of the film growth may be monitored in situ using ellipsometry, interferometry, a quartz crystal microbalance, or other techniques to measure deposition thickness and/or uniformity. When the desired thickness has been reached, the substrate is removed from the VDP chamber. Standard metrology such as ellipsometry may be performed outside the tool. The films may also be non-destructively measured with infrared spectroscopy to determine polymer composition. In other examples, metrology specific to the identity and structure of the polymer can be performed by physically removing (dissolving or scraping off) the polymer from the substrate surface and performing techniques such as size exclusion chromatography, viscosity measurements, NMR, etc.

The process continues by moving the substrate to a suitable chamber to convert the polymer film on the substrate into viscoelastic fluid. In some examples, the VDP chamber is used. In other examples, the VDP chamber that is used to grow the polymer film is not used during conversion of the polymer film. In some examples, a wet chamber may be used on the same tool or a different tool, where the wet chamber will also be used to subsequently remove the viscoelastic fluid and the particles. In some examples, the polymer film is converted immediately. In other examples, the polymer film remains on the substrate for an indeterminate period and is converted at a later time.

A predetermined volume of a solution is deposited on the substrate to dissolve the previously deposited polymer film. In some examples, the solution includes water. The amount of water that is added to the substrate is monitored to ensure that a final specified weight percent concentration of polymer is created to modulate the rheological properties of the viscoelastic fluid. The final concentration of polymer affects both particle removal efficiency and the practicality of removing the viscoelastic fluid from the substrate.

In some examples, the solution includes water, an acid, a base, buffer salts, and/or surfactants to ensure that the solution is compatible with a surface of the substrate. Different additives may be used for different types of substrate surfaces (i.e., hydrophobic vs. hydrophilic). If transforming the polymer into the viscoelastic fluid requires a longer period, the substrate may be agitated using a vibrating mechanism to speed up dissolution. In some examples, water vapor is added during VDP to partially hydrate or gel the polymer, which may speed up subsequent dissolution. Other additives may be added during or immediately after VDP in the vapor phase to modify the polymer film. For example, ammonia vapor may be added to modify the pH of the film as the film is grown.

Figure 2:
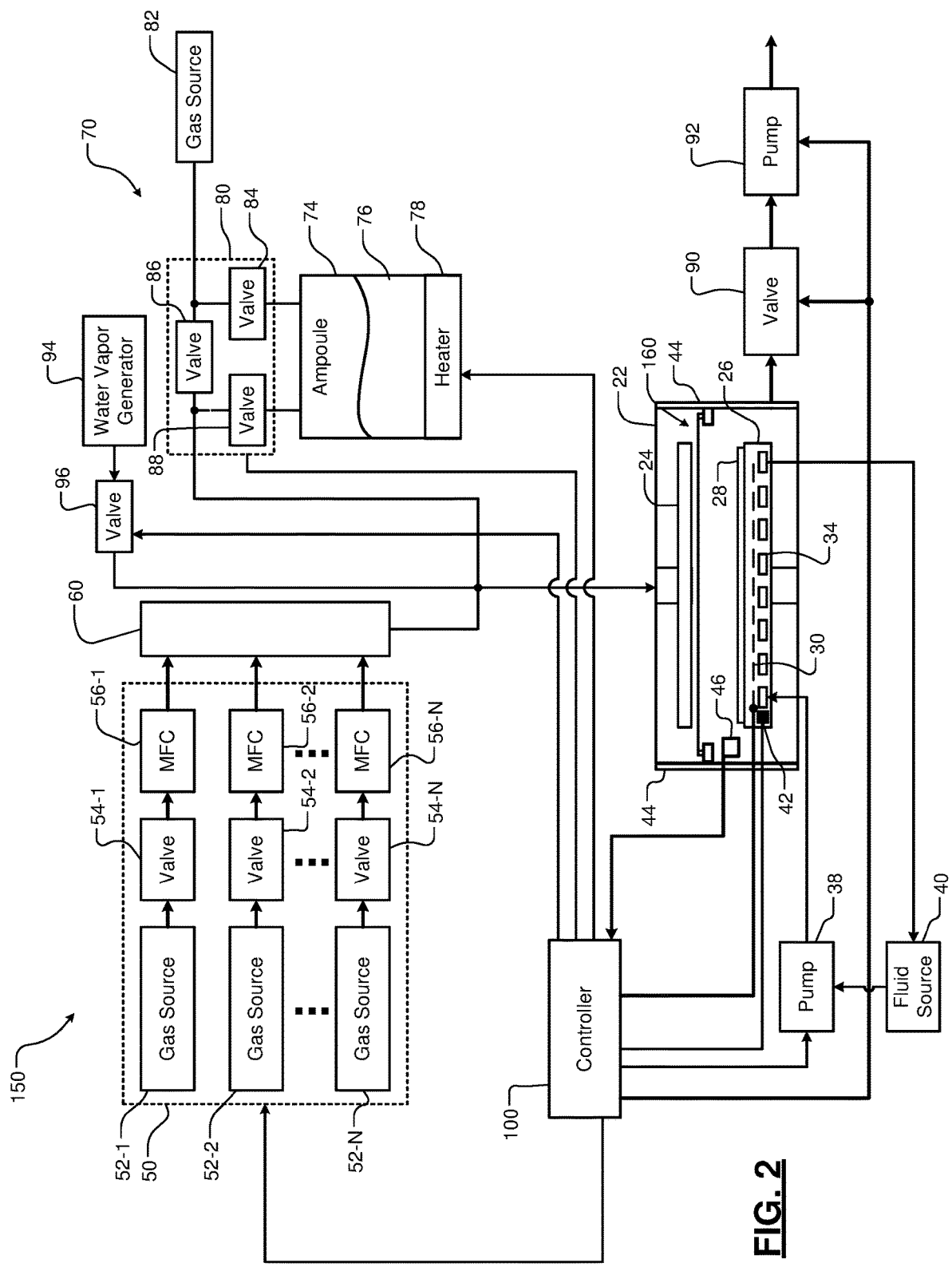
FIG. 2 is a functional block diagram of another example of a substrate processing system for performing VDP using initiated CVD (iCVD) according to the present disclosure.
Figure 3:
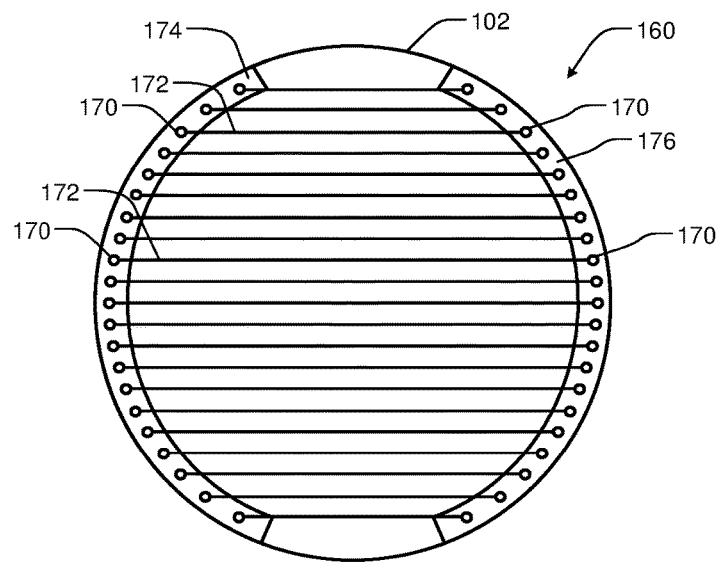
FIG. 3 is a plan view illustrating hot wire filaments used in FIG. 2 to perform iCVD.
Figure 4:
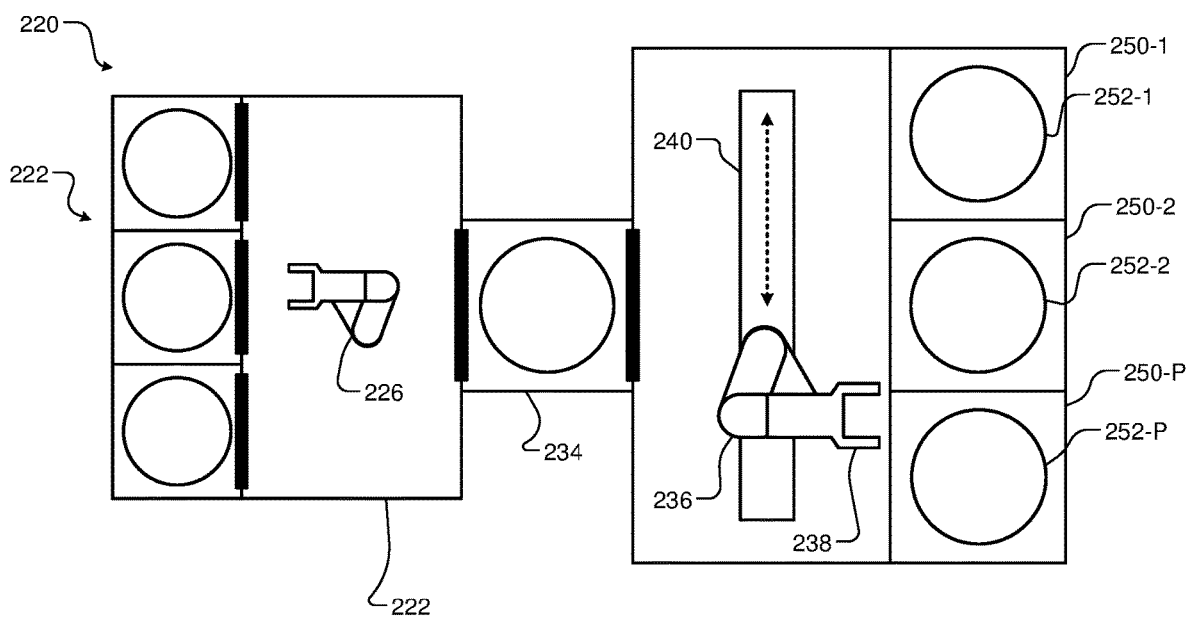
FIG. 4 is a functional block diagram of an example of a tool that performs substrate treatment, VDP of the polymer film, conversion of the polymer film to a viscoelastic fluid and removal of the viscoelastic fluid to remove particles according to the present disclosure.
Figure 5:
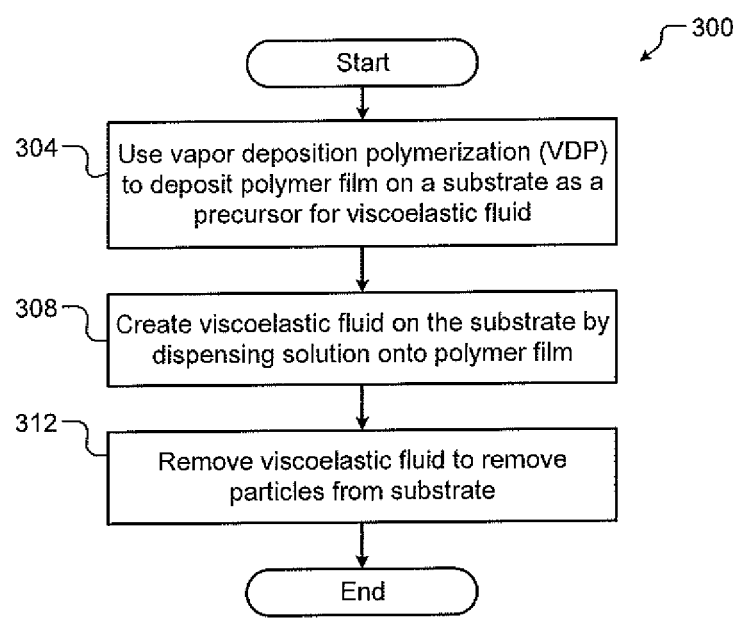
FIGS. 5-6 are flowcharts of examples of methods for removing particles from a substrate by performing VDP of a polymer film, conversion of the polymer film to a viscoelastic fluid and removal of the viscoelastic fluid to remove particles according to the present disclosure.
Figure 6:
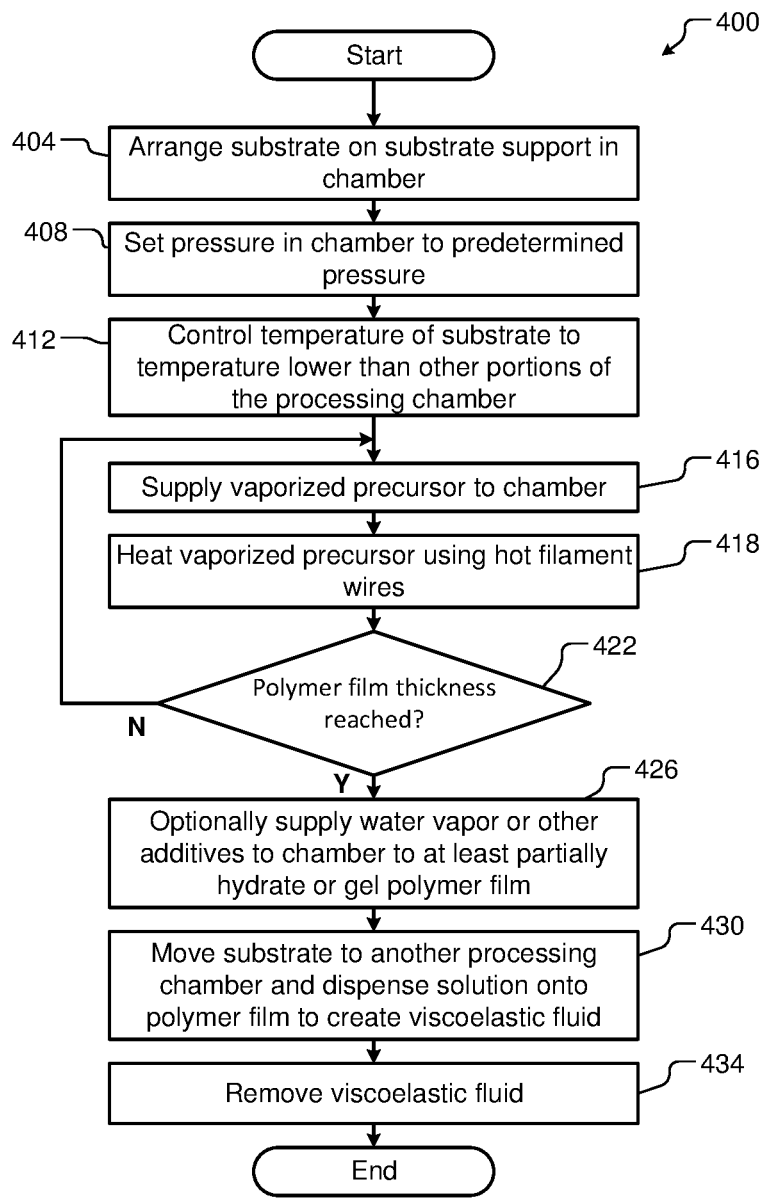

In the following description, FIG. 1 shows an example of a chamber for performing VDP according to the present disclosure. FIGS. 2 and 3 show an example of a chamber for performing iCVD using filament heaters according to the present disclosure. FIG. 4 shows an example of a tool for performing substrate treatment such as deposition, etching or photoresist removal and particle removal according to the present disclosure. FIGS. 5-6 are examples of methods for removing particles using VDP.

Referring now to FIG. 1, an example of a substrate processing system 10 for performing VDP is shown. The substrate processing system 10 includes a processing chamber 22 that encloses other components of the substrate processing system 10. The substrate processing system 10 includes a gas distribution device 24 such as a showerhead that introduces and distributes process gases. Alternately, the process gases may be introduced in another manner. A substrate support 26 may be arranged below the gas distribution device 24. In some examples, the substrate support 26 includes a pedestal or an electrostatic chuck (ESC).

In some examples, the substrate support 26 is temperature controlled. In some examples, a temperature of the substrate support is used to help initiate VDP. For example, the substrate support 26 may include resistive heaters 30 and/or cooling channels 34. The cooling channels 34 may be supplied by fluid delivered using a pump 38 and a fluid source 40. One or more sensors 42 may be used to monitor a temperature of the substrate support 26. The one or more sensors 42 may include thermocouples that are located in the substrate support 26, or in fluid conduits connected to the substrate support 26. Alternately, other types of sensors such as thermal or infrared sensors located in the processing chamber 22 (remotely from the substrate support) can be used to monitor the temperature of the substrate or substrate support.

Surfaces of the processing chamber 22 can be heated by heaters 44. While the sidewalls of the processing chamber 22 are heated in FIG. 1, other surfaces of the processing chamber 22 such as the top surface, the bottom surface and the gas distribution device can also be heated. In some examples, the surfaces of the processing chamber are heated to a temperature that is greater than a temperature of the substrate. One or more sensors 46 may be used to monitor chamber operating parameters such as temperature and/or pressure.

The substrate processing system 10 further includes a gas delivery system 50 with one or more gas sources 52-1, 52-2, . . . , and 52-N (collectively gas sources 52), where N is an integer greater than zero. The gas sources supply one or more gases to the processing chamber 22. The gas sources 52 are connected by valves 54-1, 54-2, . . . , and 54-N (collectively valves 54) and mass flow controllers 56-1, 56-2, . . . , and 56-N (collectively mass flow controllers 56) to a manifold 60. An output of the manifold 60 is fed to the processing chamber 22. For example only, the output of the manifold 60 is fed to the gas distribution device 24.

A vapor delivery system 70 may be used to deliver vaporized precursor to the processing chamber 22. The vapor delivery system 70 includes an ampoule 74 that stores liquid precursor 76. A heater 78 may be used to heat the liquid precursor as needed to increase vaporization. Pressure in the ampoule 74 may also be controlled to a predetermined pressure. Due to the monomer's instability when heated, the monomer may be kept at room temperature or even cooled, and a small portion that is delivered to a vaporizing device may be heated at point of vaporization.

A valve system 80 may be used to control the supply of carrier or push gas from a gas source 82 and/or supply of the vaporized precursor. For example, the valve system 80 may include valves 84, 86 and 88. In this example, an inlet of the valve 84 is connected between the gas source 82 and an inlet of the valve 86. An outlet of the valve 84 is connected to an inlet of the ampoule 74. An outlet of the ampoule 74 is connected to an inlet of the valve 88. An outlet of the valve 88 is connected to an outlet of the valve 86 and to an inlet of the gas distribution device 24. The valve system 80 may be configured to supply no gas, carrier gas and/or carrier gas and vaporized precursor.

A valve 90 and pump 92 may be used to control pressure in the processing chamber 22 and/or to evacuate reactants from the processing chamber 22. In some examples, a vapor generator 94 and a valve 96 may be used to supply water vapor to the processing chamber to at least partially hydrate or gel the polymer in situ. In some examples, the vapor generator 94 may also supply other vapors such as ammonia vapor or vapor of a volatile amine.

A controller 100 may be used to control various components of the substrate processing system 10. For example only, the controller 100 may be used to control flow of process, carrier and precursor gases, vaporized precursor, water vapor, ammonia vapor, removal of reactants, monitoring of chamber parameters, etc.

Referring now to FIGS. 2-3, a substrate processing system 150 for performing initiated chemical vapor deposition (iCVD) is shown. The substrate processing system 150 is similar to the substrate processing system 10 described above. However, the substrate processing system 150 further includes a plurality of hot filament wires generally identified at 160 in FIG. 2. Heat produced by the hot filament wires 160 are used to initiate reactions. In FIG. 3, an example of the plurality of hot filament wires 160 is shown to include conductor pairs 170 that are connected to hot filament wires 172. In this example, the conductor pairs 170 are attached to a first support and a second support 174, 176 that are arranged in the processing chamber 22 (e.g. attached to sidewalls of the processing chamber 22).

Referring now to FIG. 4, a tool 220 including multiple processing chambers is shown. A substrate enters the tool 220 from a cassette loaded through a pod 222, such as the front opening unified pod (FOUP). A robot 226 includes one or more end effectors to handle the substrates. A pressure of the robot 226 is typically at atmospheric pressure. The robot 226 moves the substrates from the cassette to one port of a transfer chamber 234. The transfer chamber 234 pumps pressure therein to an appropriate level.

Another port to the transfer chamber 234 opens and a robot 236 with one or more end effectors 238 delivers the substrate to a selected one of a plurality of processing chambers 250-1, 250-2, . . . , and 250-P (collectively processing chambers 250), where P is an integer greater than one. The robot 236 may move along a track 240. The robot 236 delivers the substrate onto one of a plurality of pedestals 252-1, 252-2, . . . , and 252-P corresponding to the selected one of the processing chambers 250. In some examples, the transfer chamber is omitted when selected chambers operate at ambient pressure.

In some examples, at least one of the processing chambers 250 performs substrate treatment such as cleaning, deposition, etching or photoresist removal and at least another one of the processing chambers 250 performs VDP of the polymer as a precursor to the viscoelastic fluid. A solution is subsequently added by one of the chambers to convert the polymer film on the substrate to viscoelastic fluid. Finally, the viscoelastic fluid is removed by one of the chambers to remove the particles.

Referring now to FIG. 5, a method 300 for removing particles from a substrate is shown. At 304, vapor deposition polymerization (VDP) is used to deposit polymer film on a substrate as a precursor for a viscoelastic fluid. At 308, a solution is used to dissolve the polymer film on the substrate to create a viscoelastic fluid. At 312, the viscoelastic fluid is removed to remove particles from the substrate.

Referring now to FIG. 6, a method 400 for removing particles from a substrate is shown. While a specific method is shown in FIG. 6, other variations described herein can also be used. At 404, a substrate is arranged on a substrate support in a processing chamber. At 408, pressure in the processing chamber is set to a predetermined pressure.

At 412, a temperature of the substrate is controlled to a temperature lower than other portions of the processing chamber to allow the polymer film to preferentially deposit on the substrate. At 416, vaporized precursor is supplied to the processing chamber. At 418, the vaporized precursor is heated using a plurality of hot filament wires. The method waits a predetermined period for the film to deposit and/or monitors a thickness of the film using a sensor. When a sufficient thickness is deposited or the predetermined period is up as determined at 422, the method continues at 426.

At 426, water vapor is optionally supplied to the processing chamber to at least partially gel the polymer film before the substrate is removed from the processing chamber. At 430, the substrate is moved to another processing chamber and a solution is dispensed onto the polymer film to create a viscoelastic fluid. As can be appreciated, the water vapor can be used in the same processing chamber as the dispensing of the solution instead of or in addition to the processing chamber where VDP is performed. At 434, the viscoelastic fluid is removed to remove particles from the substrate.

In some examples, iCVD initiators include organic peroxides such as tert-butyl peroxide or tert-butyl peroxybenzoate. Other chemicals may be viable if they are relatively stable, have a high vapor pressure, and efficiently decompose under/at the hot-wire temperatures to produce radicals. Besides peroxides, nitriles, such as azobisisobutyronitrile, can also generate radicals for polymerization, but most commercial nitriles lack a sufficiently high vapor pressure to be used in iCVD.

In some examples, a hot-wire temperature is in a range between 150° C. to 400° C. In other examples, the hot-wire temperature is in a range between 200° C. to 300° C.

In some examples, to achieve the desired viscoelastic rheological behavior, the synthesized polymer has an ultra-high molecular weight. In some examples, the molecular weight is more than five hundred thousand (500,000) grams per mole. In other examples, the molecular weight is more than ten million (10,000,000) grams per mole. To do this with iCVD, high deposition rates are used since polymer chain length is largely kinetically controlled. As used herein, high deposition rate refers to deposition rates that are greater than at least 0.5 µm per minute. In some examples, the high deposition rates are achieved by lowering the temperature of the substrate to promote adsorption, and maintaining a high flow-rate of precursors. In some examples, a high precursor flow-rate refers to a flow rate of at least 10 sccm total. In some examples, a high precursor flow-rate refers to a flow rate of at least 25 sccm total.

It may be possible to effectively create the desired polymer molecular weight by incorporating a small amount of cross-linker during deposition and potentially foregoing the need for high deposition rates. However, this route is undesirable since the ratio of cross-linker to other precursors would need to be tightly controlled. Even a slight excess of cross-linker would lead to insoluble polymers. In some examples, the cross-linkers include monomers with two vinyl groups. In some examples, ethylene diacrylate is used.

It is often difficult to dissolve ultrahigh molecular weight polymers. Co-deposition of the polymer with the solvent (water) may help to alleviate this issue since the water-swollen material may be more amenable to subsequent dissolution. In the water-swollen or gel state, the material will not flow off of the wafer, enabling transport of the wafer if needed. In addition, ammonia gas or other volatile amines such as trimethylamine can be used to convert the acrylic acid to an ammonium or amine salt, which may further help decrease the time for dissolution.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. A method for cleaning a substrate comprising:
    supplying a vapor to a processing chamber to grow a polymer film on the substrate in the processing chamber using initiated chemical vapor deposition (iCVD);
    supplying a water vapor and optionally an additive to the processing chamber while supplying the vapor;
    adding a solution to the polymer film on the substrate to create a viscoelastic fluid on the substrate; and
    removing the viscoelastic fluid to remove particle contaminants from the substrate.

2. The method of claim 1, wherein the vapor further comprises at least one monomer and an initiator.

3. The method of claim 2, further comprising using a source of energy to decompose the initiator.

4. The method of claim 1, wherein the solution includes at least one of water, buffered water, an acid, a base, buffer salts and surfactants.

5. The method of claim 1, further comprising:
    creating a temperature differential between the substrate and other surfaces in the processing chamber while growing the polymer film,
    wherein the substrate is maintained at a lower temperature than the other surfaces to promote adsorption of the polymer film on the substrate.

6. The method of claim 1, wherein a predetermined volume of the solution is added.

7. The method of claim 1, wherein the solution is added to produce a final desired concentration of polymer.

8. The method of claim 1, wherein after supplying the vapor and growing the polymer film and before adding the solution, moving the substrate to a second processing chamber.

9. The method of claim 1, wherein pressure in the processing chamber is maintained at a predetermined pressure in a pressure range from 50 mTorr to 10 Torr while growing the polymer film.

10. The method of claim 1, further comprising supplying the water vapor and optionally the additive to the processing chamber after supplying the vapor.

11. The method of claim 1, wherein the water vapor and optionally the additive at least partially hydrate the polymer film.

12. The method of claim 11, wherein the additive comprises at least one of ammonia vapor and a vapor of a volatile amine.

13. The method of claim 1, further comprising agitating the substrate at least one of while supplying the solution and after supplying the solution.

14. The method of claim 1, wherein adding the solution includes dispensing the solution onto the substrate.

15. The method of claim 1, further comprising:
    monitoring a weight of the substrate while the solution is added; and
    controlling addition of the solution to the substrate based on the weight.

16. The method of claim 3, wherein the source of energy includes a heated surface.

17. The method of claim 16, wherein the heated surface comprises a wire filament.

18. A method for cleaning a substrate comprising:
    supplying a vapor including at least one monomer and an initiator to a processing chamber including the substrate;
    using a source of energy to trigger a reaction in the vapor and to cause a polymer film to be deposited on the substrate in the processing chamber using initiated chemical vapor deposition (iCVD),
    supplying a water vapor to the processing chamber while supplying the vapor; and
    adding a solution to the polymer film on the substrate to create a viscoelastic fluid on the substrate.

19. The method of claim 18, further comprising removing the viscoelastic fluid to remove particle contaminants from the substrate.

20. The method of claim 18, wherein the solution includes at least one of water, buffered water, an acid, a base, buffer salts and surfactants.

21. The method of claim 18, further comprising:
    creating a temperature differential between the substrate and other surfaces of the processing chamber while depositing the polymer film,
    wherein the substrate is maintained at a lower temperature than the other surfaces to promote adsorption of the polymer film on the substrate.

22. The method of claim 18, further comprising, prior to adding the solution, supplying an additive to the processing chamber to modify the polymer film.

23. The method of claim 18, wherein adding the solution includes:
    dispensing the solution onto the substrate;
    monitoring a weight of the substrate while the solution is added; and
    controlling addition of the solution to the substrate based on the weight.

24. The method of claim 18, wherein the source of energy includes a heat source.

* * * * *